US005859669A

United States Patent [19]
Prentice

[11] Patent Number: 5,859,669

[45] Date of Patent: Jan. 12, 1999

[54] SYSTEM FOR ENCODING AN IMAGE CONTROL SIGNAL ONTO A PIXEL CLOCK SIGNAL

[75] Inventor: Richard Mark Prentice, Wylie, Tex.

[73] Assignee: Texas Instruments Incorporated, Dallas, Tex.

[21] Appl. No.: 756,631

[22] Filed: Nov. 26, 1996

[51] Int. Cl.[6] .............................. H04N 5/06; H04N 7/04; H03M 5/08

[52] U.S. Cl. ............................ 348/469; 349/99; 370/212; 370/537; 341/53; 375/238

[58] Field of Search .................................... 348/508, 512, 348/521, 524, 537, 538, 541, 213, 495, 500, 792, 791, 793, 469, 473; 327/175; 375/238, 239, 241, 359–364, 371–375; 345/99, 213, 214, 98; 370/205, 212, 537; 341/53, 182; H04N 5/06

[56] References Cited

U.S. PATENT DOCUMENTS 5,140,611 8/1992 Jones et al. ................................ 375/7
5,349,585 9/1994 Soukal ................................ 370/110.4
5,577,071 11/1996 Gehrke et al. .......................... 375/259
5,675,355 6/1996 Chiu et al. ................................ 345/99

*Primary Examiner*—Andrew I. Faile
*Assistant Examiner*—Ronald D. House
*Attorney, Agent, or Firm*—Alan K. Stewart; Wade James Brady, III; Richard L. Donaldson

[57] ABSTRACT

A system for encoding control data onto a clock signal includes at least one clock cycle in the clock signal; a first transition in the at least one clock cycle, the first transition is from a first voltage level to a second voltage level, the first transition is in a first location in the at least one clock cycle; a second transition in the at least one clock cycle, the second transition is from the second voltage level to the first voltage level, the second transition has a variable location in the clock cycle; and an encoder circuit for positioning the second transition in the variable location in response to the control data.

11 Claims, 2 Drawing Sheets

FIG. 2
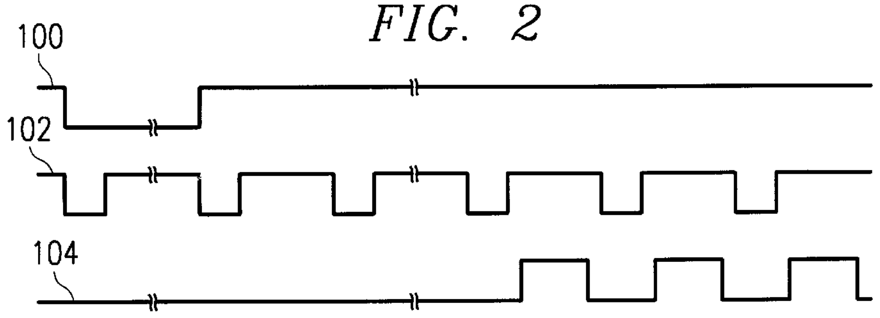
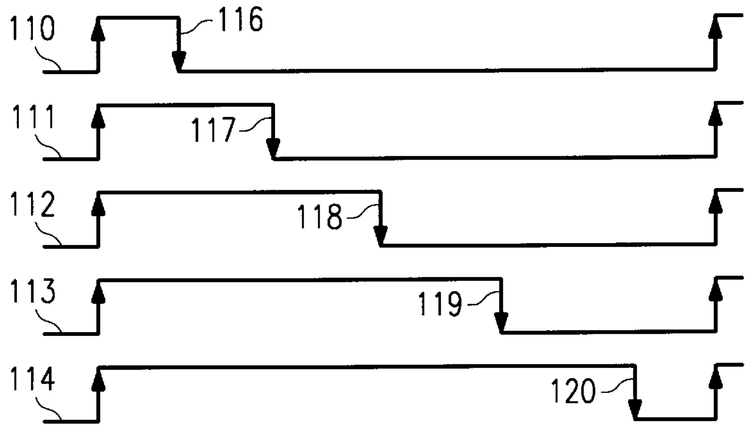
FIG. 3
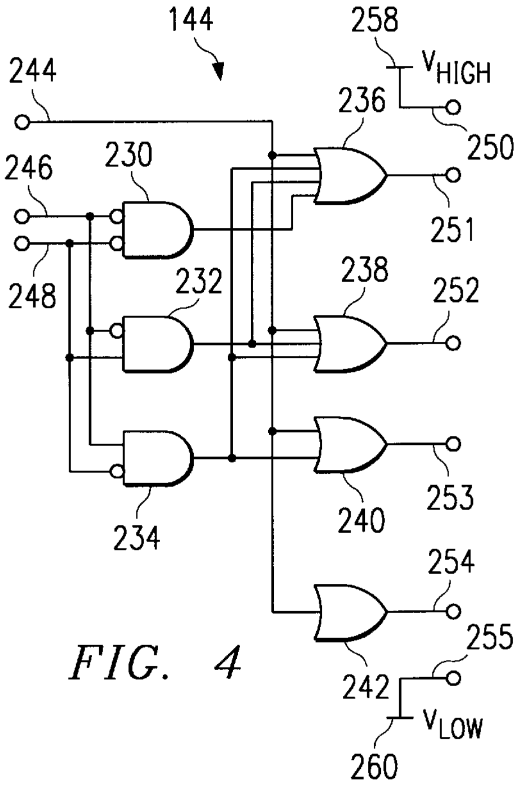
FIG. 4
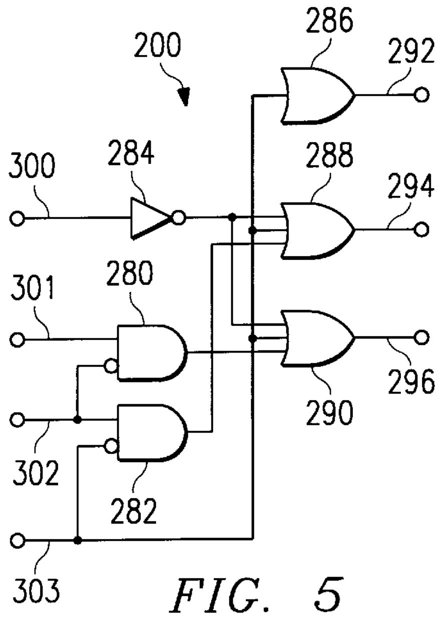
FIG. 5

SYSTEM FOR ENCODING AN IMAGE CONTROL SIGNAL ONTO A PIXEL CLOCK SIGNAL

FIELD OF THE INVENTION

This invention generally relates to encoding an image control signal onto a pixel clock signal.

BACKGROUND OF THE INVENTION

Without limiting the scope of the invention, its background is described in connection with a color display panel having an image size of 768×1024 pixels at a 60 Hz frame rate, as an example. The 768×1024 pixels are Just the active, viewable area. In addition, there is a blanked area around the viewable area, and horizontal and vertical sync pulses. The blanked area includes 180 additional pixels per line and 32 additional lines for an effective image size of 800×1204 pixels. Also, there are an additional 136 pixels per line during horizontal sync and 6 additional lines during vertical sync. This provides an effective image size of 806×1340. An 806×1340 image at a 60 Hz refresh rate requires a pixel rate of 64,802,400 pixels per second. A color image with 8 bits each for red, green, and blue, plus three bits for three control lines requires 27 bits/pixel to be transferred across a notebook computer hinge at about 65 MHz for an image of 768×1024.

SUMMARY OF THE INVENTION

Generally, and in one form of the invention, the system for encoding control data onto a clock signal includes at least one clock cycle in the clock signal; a first transition in the at least one clock cycle, the first transition is from a first voltage level to a second voltage level, the first transition is in a first location in the at least one clock cycle; a second transition in the at least one clock cycle, the second transition is from the second voltage level to the first voltage level, the second transition has a variable location in the clock cycle; and an encoder circuit for positioning the second transition in the variable location in response to the control data.

BRIEF DESCRIPTION OF THE DRAWINGS

In the drawings:

FIG. 2 is timing diagram of the image data control signals;

FIG. 3 is a diagram of the pixel clock signal with five different falling edge locations;

FIG. 4 is a logic circuit diagram of the control signal encoder of FIG. 1;

FIG. 5 is a logic circuit diagram of the control signal decoder of FIG. 1.

Corresponding numerals and symbols in the different figures refer to corresponding parts unless otherwise indicated.

DETAILED DESCRIPTION OF PREFERRED EMBODIMENTS

Figure 1:
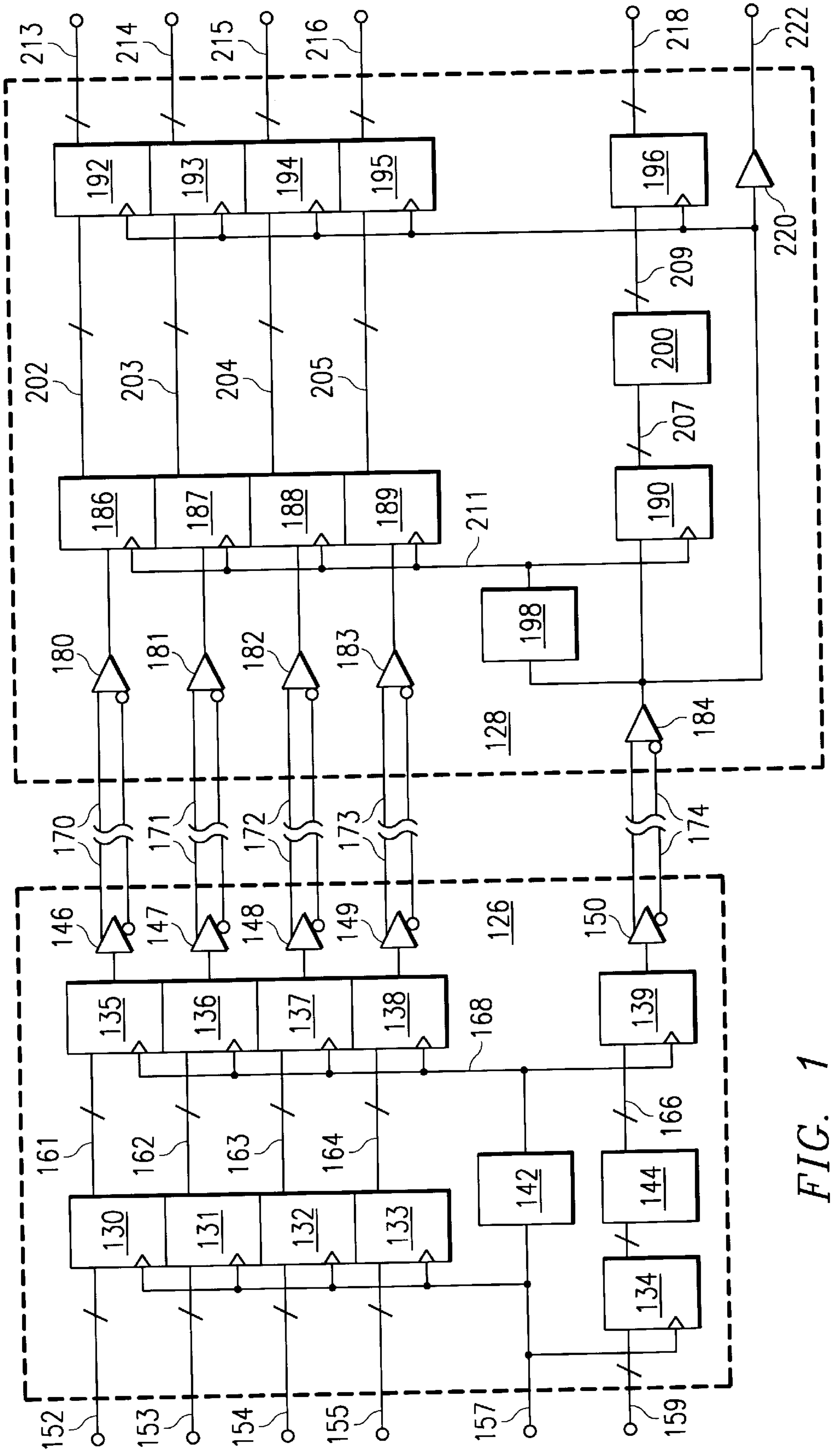
FIG. 1 is the preferred embodiment architecture for the image data transfer.

A preferred embodiment architecture of the transmit/receive functions of the image data transfer is shown in FIG. 1. FIG. 1 includes transmit device 126 and receive device 128. The transmit device 126 includes latches 130–134, serializers 135–139 that are six bits each, 6X PLL 142 which steps up the pixel by a factor of six, control bit encoder 144 which converts the three control bits into a set of six bits, differential drivers 146–150, image data input lines 152–155 which include six parallel lines each, pixel clock line 157, control line 159 which includes three control lines, lines 161–164 which couple the latches 130–133 to the serializers 146–149 and include six lines each, line 166 which couples the control bit encoder 144 to serializer 139 and includes six lines, 6X clock line 168, and five LVDS pairs 170–174. The receive device 128 includes differential amplifiers 180–184, deserializers 186–190, latches 192–196, 6X PLL 198, control signal decoder 200, lines 202–205 which couple the deserializers 186–189 to the latches 192–195 and include six lines each, line 207 which couples deserializer 190 to decoder 200 and includes four lines, line 209 which couples decoder 200 to latch 196 and includes three lines, 6X clock line 211, image data output lines 213–216 which include six parallel lines each, control signal output line 218 which includes three lines, pixel clock refresh amplifier 220, and pixel clock output line 222.

The preferred embodiment architecture of FIG. 1 uses low voltage differential signaling (LVDS) serial lines 170–174 to move the image data across the notebook computer hinge. LVDS is differential for better immunity to noise and easier shielding. LVDS can transfer data at a higher data rate than TTL because LVDS has a small signal swing and controlled rise time. The preferred embodiment system uses four LVDS lines 170–173 to carry the 24 bits across the hinge. Six bits are carried on each of the LVDS lines 170–173 by operating at six times the speed of the pixel clock (for example, 6×65 MHz is 390 MHz). In addition, the pixel clock is transferred across the hinge on one LVDS line 174. This requires a total of five LVDS lines, four of which are transmitting data at 390 Mbaud and one having a clock of 65 MHz.

The 24 bits of image data are latched into the circuit of FIG. 1 by the pixel clock. A phase locked loop (PLL) 142 steps up the pixel clock by a factor of six. For a pixel clock operating at 65 MHz, the phase locked loop 142 steps up the frequency to 390 MHz. The stepped up clock rate is used to clock a bank of four 6-bit parallel to serial converters (serializers) 135–138. Each serializer 135–138 converts the six bits parallel into a stream of six bits serial. The four serial streams and the pixel clock are sent out through LVDS drivers 146–150.

To receive the LVDS serial pixel data and convert it back into 24 bits parallel at the pixel clock rate, the above process is reversed. Each of the four LVDS pairs 170–173 is received and goes to one of the serial-to-parallel converters (deserializers) 186–189. The LVDS pixel clock is received and PLL 198 steps up the pixel clock by a factor of six. The stepped up clock rate clocks the deserializers 186–189 which provide 4 sets of six bit parallel data pins at the pixel clock rate.

The preferred embodiment of FIG. 1 encodes the three bits of control information onto the pixel clock. The three control bits that are encoded onto the pixel clock represent horizontal sync, vertical sync, and data enable. (The inverse of data enable is also called blanking.) Although three bits have eight possible combinations, only five of those combinations are used for the three control bits. Those five combinations for the data enable, horizontal sync, and vertical sync, in that order, are: 000, 001, 010, 011, and 111. The other three combinations (100, 101, and 110) are not used.

The timing diagram of FIG. 2 shows a typical timing relationship of the three control bits. Timing signal 100 is the vertical sync. Timing signal 102 is the horizontal sync.

Timing signal 104 is the data enable. As shown in FIG. 2, the data enable signal 104 only goes active while the vertical sync 100 and horizontal sync 102 are inactive. Therefore, there are only five valid combinations of the three control bits.

In the preferred embodiment, the five combinations of the three control bits (horizontal sync, vertical sync, and data enable) are encoded on the LVDS pixel clock. Since the phase detector of the receive PLL 198 is designed to work on the rising edges of the pixel clock, the duty cycle of the pixel clock is irrelevant. The falling edge of the pixel clock can be anywhere in the clock cycle. By choosing five discrete locations within the pixel clock cycle to place the falling edge, the five combinations of the three control bits can be easily encoded onto the pixel clock.

FIG. 3 shows five pixel clock cycles 110–114 with five different locations 116–120 for the falling edge. As shown in FIG. 3, there is still only one location for the rising edge on the pixel clock for each clock cycle. For decoding the control bits from the pixel clock, the six times pixel clock rate from the PLL 198 can sample the pixel clock to determine the position of the falling edge for one of the five control bit combinations.

A preferred embodiment encoder circuit 144 is shown in FIG. 4. The circuit of FIG. 4 includes “and” gates 230, 232, and 234, “or” gates 236, 238, 240, and 242 (single input “or” gate 242 is a buffer), data enable input line 244, vertical sync input line 246, horizontal sync input line 248, six parallel output lines 250–255, $V_{high}$ node 258, and $V_{low}$ node 260. The last of the six bits to be serialized (node 260) is always low and the first of the six bits (node 258) is always high. This assures that the rising edge is always in the same position in the clock cycle. The circuit of FIG. 4 simply determines one of five positions to place the falling edge of the LVDS pixel clock. If any of the three invalid combinations of control bits is applied to the circuit of FIG. 4, the encoding will be to the valid combination of “111” (data enable active, horizontal sync inactive, and vertical sync inactive).

The three control bits are supplied to the encoder circuit 144 by line 159. The encoder circuit 144 provides the encoded control signal on six parallel lines 166. The serializer 139 converts the six bits parallel into a stream of six bits serial. This serial stream is sent out through LVDS driver 150.

A preferred embodiment decoder circuit 200 is shown in FIG. 5. The circuit of FIG. 5 includes “and” gates 280 and 282, inverter 284, “or” gates 286, 288, and 290, data enable output line 292, vertical sync output line 294, horizontal sync output line 296, and input lines 300–303. The data on input lines 300–303 corresponds with the data on lines 251–254, shown in FIG. 4, respectively.

Deserializer 190 deserializes the LVDS pixel clock and outputs four parallel lines 207 with the encoded control signals. Control signal decoder 200 converts the four bits from the pixel clock deserializer 190 into the three control bits on line 209.

One advantage of the preferred embodiment is that for a 6X PLL, a 65 MHz pixel clock requires only a 390 Mbaud rate on the LVDS lines, which is within the capabilities of the present 3 volt LVDS technology.

A few preferred embodiments have been described in detail hereinabove. It is to be understood that the scope of the invention also comprehends embodiments different from those described, yet within the scope of the claims. For example, the control signal could consist of one line instead of three. This single line of control data can be encoded onto the clock signal in a manner similar to that described for the preferred embodiment. The single control line can be transmitted as a subset of the 3 control lines. The vertical sync and horizontal sync can be held inactive and the single control line can be input on the data enable input line. This allows the two states of the single control line to be encoded on the pixel clock using the circuitry described above for the preferred embodiment.

Also, the clock encoding circuit of FIG. 4 and the clock decoding circuit of FIG. 5 are only one of many possible configurations for performing the desired clock encoding and decoding. The five states of the control signal can be assigned to five positions of the falling edge of the clock signal in any order desired.

While this invention has been described with reference to illustrative embodiments, this description is not intended to be construed in a limiting sense. Various modifications and combinations of the illustrative embodiments, as well as other embodiments of the invention, will be apparent to persons skilled in the art upon reference to the description. It is therefore intended that the appended claims encompass any such modifications or embodiments.

What is claimed is:

1. A system for encoding control data onto a clock signal comprising:

at least one clock cycle in the clock signal;

a first transition in the at least one clock cycle, the first transition is from a first voltage level to a second voltage level, the first transition is in a first location in the at least one clock cycle;

a second transition in the at least one clock cycle, the second transition is from the second voltage level to the first voltage level, the second transition has a variable location in the clock cycle; and an encoder circuit for positioning the second transition in the variable location in response to the control data;

wherein the control data comprises three control bits.

2. The system of claim 1 wherein the three control bits have five valid combinations.

3. The system of claim 2 wherein the variable location is one of five discrete locations.

4. The system of claim 3 wherein each of the five valid combinations are encoded onto a corresponding one of the five discrete locations.

5. A device for transmitting video signals comprising:

video signal bits having parallel image data bits and at least one control bit;

at least one image serializer for converting the parallel image data bits to serial data;

an encoder circuit for converting the at least one control bit to parallel clock encoding data;

a control signal serializer for providing an encoded clock signal; and a clock signal for clocking the at least one image serializer and the control signal serializer.

6. The device of claim 5 further comprising at least one differential driver for receiving corresponding serial data from the at least one image serializer.

7. The device of claim 5 further comprising at least one latch for coupling the parallel image data bits to a corresponding at least one image serializer.

8. The device of claim 5 further comprising a differential driver for receiving the encoded clock signal.

9. The device of claim 5 further comprising a phase locked loop for providing the clock signal.

10. The device of claim 5 wherein the image serializers convert six parallel image bits to serial data.

11. A method for transferring video signals comprising:

encoding control data onto a clock signal to provide an encoded clock signal;

converting parallel video data to serial data;

transferring the serial data and the encoded clock signal through differential lines;

converting the serial data on the differential lines to parallel data; and decoding the encoded clock signal to obtain the control data and the clock signal.

* * * * *